(12) United States Patent
Neukam

(10) Patent No.: US 10,481,647 B2
(45) Date of Patent: Nov. 19, 2019

(54) COMPUTER SYSTEM INCLUDING A COMPUTER HOUSING WITH A FASTENING DEVICE

(71) Applicant: Fujitsu Technology Solutions Intellectual Property GmbH, München (DE)

(72) Inventor: Wilhelm Neukam, München (DE)

(73) Assignee: Fujitsu Client Computing Limited, Kawasaki (JP)

( * ) Notice: Subject to any disclaimer, the term of this patent is extended or adjusted under 35 U.S.C. 154(b) by 0 days.

(21) Appl. No.: 15/918,251

(22) Filed: Mar. 12, 2018

(65) Prior Publication Data
US 2018/0267579 A1    Sep. 20, 2018

(30) Foreign Application Priority Data

Mar. 15, 2017  (DE) .......................... 10 2017 105 553

(51) Int. Cl.
| | |
|---|---|
| *H05K 7/00* | (2006.01) |
| *G06F 1/18* | (2006.01) |
| *G06F 1/20* | (2006.01) |
| *H05K 7/20* | (2006.01) |

(52) U.S. Cl.
CPC ................ *G06F 1/181* (2013.01); *G06F 1/20* (2013.01); *H05K 7/20145* (2013.01); *H05K 7/20172* (2013.01); *G06F 2200/1631* (2013.01)

(58) Field of Classification Search
None
See application file for complete search history.

(56) References Cited

U.S. PATENT DOCUMENTS

| | | | | |
|---|---|---|---|---|
| 6,266,243 B1* | 7/2001 | Tomioka | ............... | G06F 1/1632 165/104.33 |
| 6,353,536 B1* | 3/2002 | Nakamura | ............ | G06F 1/1632 361/679.41 |
| 7,019,968 B2* | 3/2006 | Kitahara | ............... | G06F 1/1632 165/121 |
| 7,064,954 B1 | 6/2006 | Wu et al. | | |

(Continued)

FOREIGN PATENT DOCUMENTS

CN    105487603 A    4/2016

OTHER PUBLICATIONS

"HP TouchSmart 520 All-In-One Touchscreen PC Review", retrieved from https://web.archive.org/web/20160319150853/https://www.ocinside.de/review/hp_touchsmart_520/2/.

(Continued)

*Primary Examiner* — Courtney L Smith
*Assistant Examiner* — Rashen E Morrison
(74) *Attorney, Agent, or Firm* — DLA Piper LLP (US)

(57) ABSTRACT

A computer system includes a computer housing with a fastening device that fastens the computer housing to a mount; a system component arranged in the computer housing and having at least one component to be cooled; a fan that cools the at least one component arranged in the computer housing in a region of the at least one component; a first ventilation area arranged laterally next to the fastening device in a first housing wall of the computer housing; and a ventilation channel extending in the computer housing between the first ventilation area and the fan, which is fluidically separated from the rest of the computer housing.

20 Claims, 3 Drawing Sheets

(56) References Cited

U.S. PATENT DOCUMENTS

| | | | |
|---|---|---|---|
| 7,788,436 B2* | 8/2010 | Mok | G06F 1/1632 710/304 |
| 2002/0018335 A1* | 2/2002 | Koizumi | G06F 1/1632 361/679.47 |
| 2003/0128503 A1 | 7/2003 | Takahashi | |
| 2004/0123604 A1* | 7/2004 | Pokharna | G06F 1/1632 62/3.2 |
| 2006/0104023 A1 | 5/2006 | Lee et al. | |
| 2008/0089028 A1 | 4/2008 | Kim et al. | |
| 2009/0185347 A1 | 7/2009 | Sun et al. | |
| 2010/0172098 A1* | 7/2010 | Isoshima | H05K 7/20972 361/697 |
| 2011/0267769 A1* | 11/2011 | Nakamura | G06F 1/1632 361/679.48 |
| 2012/0106064 A1 | 5/2012 | Li et al. | |
| 2012/0120581 A1* | 5/2012 | Haren | G06F 1/1607 361/679.21 |
| 2012/0140399 A1 | 6/2012 | Huang et al. | |
| 2012/0151098 A1* | 6/2012 | Sullivan | G06F 1/1607 710/13 |
| 2013/0027876 A1 | 1/2013 | Chao et al. | |
| 2013/0264919 A1* | 10/2013 | Sullivan | H05K 5/0204 312/223.2 |
| 2013/0271905 A1* | 10/2013 | Sullivan | G06F 1/16 361/679.02 |
| 2013/0308266 A1* | 11/2013 | Sullivan | G06F 1/20 361/679.46 |
| 2013/0319638 A1 | 12/2013 | Degner et al. | |
| 2014/0113540 A1 | 4/2014 | Dunn et al. | |
| 2014/0355206 A1* | 12/2014 | Sullivan | G06F 1/20 361/679.54 |
| 2016/0312950 A1* | 10/2016 | Bowman | F16M 11/14 |
| 2017/0168531 A1* | 6/2017 | Casparian | G06F 1/206 |

OTHER PUBLICATIONS

"Flat Display Mounting Interface (VESA-Standards: MIS-D, MIS-E, MIS-F)", Wikipedia, retrieved from https://en.wikipedia.org/wiki/Flat_Display_Mounting_Interface.

Combined Search and Examination Report dated Aug. 9, 2018, of counterpart Great Britain Application No. GB1802632.8.

* cited by examiner

COMPUTER SYSTEM INCLUDING A COMPUTER HOUSING WITH A FASTENING DEVICE

TECHNICAL FIELD

This disclosure relates to a computer system including a computer housing with a fastening device that fastens the computer housing to a mount.

BACKGROUND

Computer housings with a fastening device that fasten the computer housing to a mount are known. In particular, it is known to integrate individual or all components of a computer system into a housing of a display device and fasten the housing by a so-called VESA mount to a wall mount or a stand.

Such approaches provide the advantage that only one single device is necessary on a workplace of a user. Moreover, additional cabling can be dispensed with, as would be required between a conventional monitor and a computer system independent thereof, e.g. a desktop computer.

Problematic about that approach is that higher demands on the cooling of the housing are made due to the integration of additional components into one single housing. In particular, components such as a central processing unit of a computer system or a power supply unit required for the power supply thereof generate a relatively high, locally concentrated power loss, which, as a rule, requires active cooling. The fans required to that end generally lead to a thickening of a housing, which in turn leads to higher space requirements and a less attractive appearance of such a computer system compared to conventional monitors.

It could therefore be helpful to provide a new approach to cool such a computer system. In particular, it could be helpful to enable the construction of relatively simply-structured and, at the same time, slim computer systems.

SUMMARY

I provide a computer system including a computer housing with a fastening device that fastens the computer housing to a mount; a system component arranged in the computer housing and having at least one component to be cooled; a fan that cools the at least one component arranged in the computer housing in a region of the at least one component; a first ventilation area arranged laterally next to the fastening device in a first housing wall of the computer housing; and a ventilation channel extending in the computer housing between the first ventilation area and the fan, which is fluidically separated from the rest of the computer housing.

I also provide an all-in-one computer system including a computer housing; a system board arranged in the computer housing and having at least one processor to be cooled; a display screen arranged at a housing front wall of the computer housing facing a user; a fastening device that fastens the computer housing to a VESA display mount, the fastening device arranged at a rear wall of the computer housing opposite the housing front wall; a fan that cools the at least one processor arranged on the processor in a region of the fastening device; a first ventilation area arranged laterally next to the fastening device in the rear wall of the computer housing; and a ventilation channel extending in the computer housing between the first ventilation area and the fan, which is fluidically separated from the rest of the computer housing.

Figure 1:
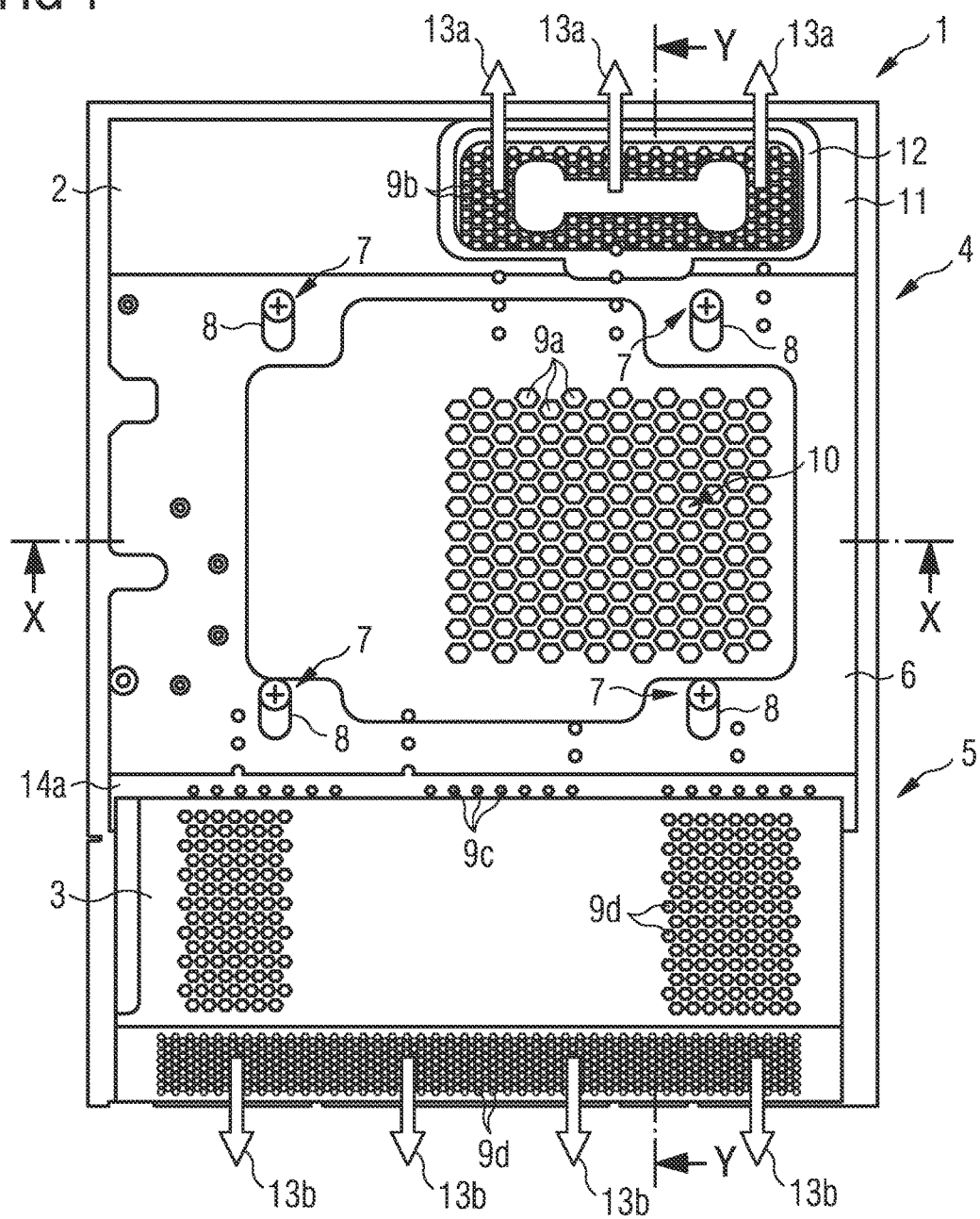
FIG. 1 shows a perspective view of a computer system according to an example.

LIST OF REFERENCE CHARACTERS 1 computer system
2 first shielding casing
3 second shielding casing
4 system component
5 power supply unit
6 rear side
7 VESA mount
8 fastening dome
9a-f ventilation opening
10 fan
11 sloping area
12 mounting flap
13a-d air flow
14a, b housing wall (of the first shielding casing)
15 ventilation channel
16 intake area
17 heat sink
18 processor
19 base
20 system board
21 display screen
22 first housing shell
23 second housing shell
24 component (of the system component)
25 first contact area
26 recess (of the first shielding casing)
27 housing wall (of the second shielding casing)
28 second contact area
29 pressure chamber
30 component (of the power supply unit)
31 storage module
32 fastening region
33 opening
34 housing rear wall (of the computer housing)
35 air vent
36 exhaust air grille
37 fresh air
38 computer housing
39 recess (of the VESA mount)

DETAILED DESCRIPTION

I provide a computer system including a computer housing with a fastening device that fastens the computer housing to a mount, a system component arranged in the computer housing and having at least one component to be cooled, and a fan arranged in the computer housing in the area of the at least one component to cool the at least one component. Furthermore, the computer system includes a first ventilation area arranged laterally next to the fastening device in a first housing wall of the computer housing, and a ventilation channel extending in the computer housing between the first ventilation area and the fan, which is fluidically separated from the rest of the computer housing.

A ventilation area is located laterally next to a region having a fastening device that fastens a computer housing. The first ventilation area and the fan, which is arranged in the area of the at least one component to be cooled, connect to one another through an internal ventilation channel. In particular, this arrangement makes it possible that the fan is located in a central area of the computer housing, which is usually formed thicker than a peripheral area of the computer housing. Provision of the laterally-offset ventilation area enables preventing a conflict with the fastening device, which is usually also arranged in the center of the housing. In this case, the ventilation channel ensures that intake fresh air does not get mixed with heated exhaust air in the computer housing.

The computer system may include a display screen with a display surface integrated in the computer housing, wherein the system component is arranged on a side of the display screen opposite the display surface. For example, the display screen can be arranged in a housing front wall facing a user, and the ventilation area can be arranged in a housing rear wall of the computer housing opposite the housing front wall. Such an arrangement enables construction of a relatively flat so-called all-in-one computer, in which all essential system components are arranged in one single housing.

The computer system may include at least one second ventilation area arranged in the first housing wall of the computer housing and spaced apart from the first ventilation area, wherein the first ventilation area intakes fresh air and the second ventilation area discharges air heated by the at least one component to be cooled, or vice versa. For example, the first ventilation area includes at least one large-surface air intake area, and the second ventilation area includes at least one slot-like air outlet area. The at least one slot-like air outlet area is formed such that the heated air discharged through it flows into a direction facing away from the at least one large-surface air intake area. Such a configuration particularly enables separate guidance of fresh air and heated exhaust air, and thus prevents direct circulation, which would result in a reduction of the cooling effect.

The computer system may include a plurality of components to be cooled, wherein the fan is arranged in the region of a processor of the system component and configured to cool all components to be cooled and arranged in the computer housing, and the plurality of components to be cooled includes at least one further component not arranged on or in the system component. For example, the at least one further component includes a component of a fan-less power supply unit that supplies the system component with at least one supply voltage. Such an approach makes it possible to dispense with additional fans and contributes to a simple and slim design of the computer housing.

The fan may be configured as an axial fan having an air guidance parallel to an axis of rotation of a fan impeller of the fan. In this case, the fan is arranged in the computer housing such that the axis of rotation is essentially perpendicular to an extension plane of a system board and an extension direction of the ventilation channel substantially parallel to the system board. The ventilation channel has a first inner width in the direction of the axis of rotation, and a second inner width perpendicular to the extension direction of the ventilation channel, wherein the first inner width is at least one order of magnitude smaller than the second inner width. Such an arrangement enables a small total thickness of the computer system when simultaneously employing a simple, cost-efficient and energy-efficient axial fan.

Further advantageous examples are indicated in the appended claims as well as in the following detailed description. The example is described in detail by the attached figures.

FIG. 1 shows a perspective view of the interior of a computer system 1. In particular, FIG. 1 shows a rear view of a so-called all-in-one desktop computer in which the essential system modules of the computer system 1 such as, in particular, a system component, a power supply unit, and a storage drive (not discernable in the detail of FIG. 1) are integrated in a housing of the computer system 1, which is also not shown in FIG. 1.

In the illustration of FIG. 1, two shielding casings 2 and 3 arranged directly one on top of the other can be discerned, in which different system modules with components of the computer system 1 contained therein are arranged. The first shielding casing 2 particularly accommodates a system component 4 in the form of a system board or mainboard. The second shielding casing 3 accommodates at least one converter circuit and further components of a power supply unit 5 for the voltage supply of the system component 4.

Although this is not recognizable in FIG. 1, the first shielding casing 2 and the second shielding casing 3 are fastened on their rear side on a support plate of a monitor. A display screen, in particular a liquid-crystal flat screen of the computer system 1 is arranged on the opposite front side of the support plate. To fasten the computer system 1 on a stand or a wall mount, four fastening domes 8 with threads of a VESA mount 7 are arranged on the rear side 6 of the first shielding casing 2 illustrated in FIG. 1. The distances between the individual fastening domes 8 are e.g. 75 mm or 100 mm according to the MIS-D standard of the Video Electronics Standards Association (VESA). The first shielding casing 2 thus also transmits force from the VESA mount 7 to the remaining modules of the computer system 1. Accordingly, the first shielding casing 2 is made of relatively stable sheet steel. The second shielding casing 3, by contrast, serves purely for electromagnetic shielding of the components of the power supply unit 5. Accordingly, the second shielding casing 3 can be made of relatively thin sheet steel, or of another conductive material.

For the ventilation of the computer system 1, the first shielding casing 2, as well as the second shielding casing 3 comprise a plurality of ventilation openings. In particular, on the rear side 6 of the first shielding casing 2, a plurality of first ventilation openings 9a is formed, through which a fan 10 located behind it takes in fresh air. The sucked-in fresh air is discharged through the remaining ventilation openings of the first shielding casing 2. For example, the first shielding casing 2 comprises, in an upper, sloping area 11, a mounting flap 12 with second ventilation openings 9b formed therein. In the example, in particular storage modules of the computer system 1 are arranged below the mounting flap 12. Fresh air sucked in by the fan 10 is therefore blown out as first air flow 13a over the storage modules and through the second ventilation openings 9b of the mounting flap 12 out of the first shielding casing 2.

Below the first shielding casing 2, the second shielding casing 3 of the power supply unit 5 directly adjoins. It can be discerned in FIG. 1, that a lower housing wall 14a of the first shielding casing 2, which is in contact with the corresponding upper housing wall of the second shielding casing 3, comprises a plurality of third ventilation openings 9c.

Likewise, the second shielding casing 3 comprises fourth ventilation openings 9d on multiple sides.

The fan 10 generates an overpressure in the first shielding casing 2. A cooling air ventilating coupling between the two shielding casings 2 and 3 is enabled through the directly neighboring arrangement of the two shielding casings 2 and 3. Thus, a second air flow 13b is generated from the first ventilation openings 9a via the fan 10 through the third ventilation openings 9c of the lower housing wall 14a, the ventilation openings of the opposite upper housing wall of the second shielding casing 3, and the corresponding fourth ventilation openings 9d of the second shielding casing 3, as described in detail below.

Figure 2:
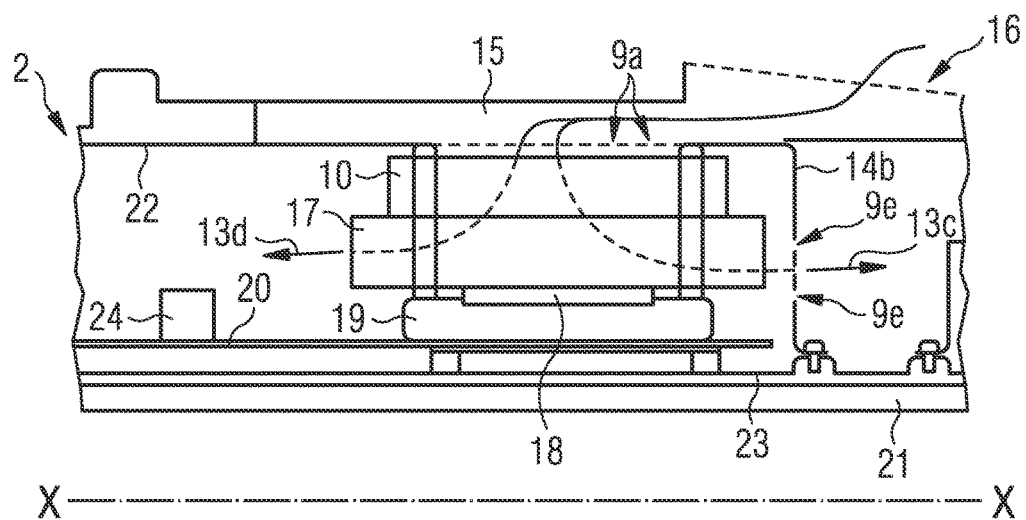
FIG. 2 shows a first cross section through a housing of the computer system according to FIG. 1.

FIG. 2 schematically shows a cross section along the sectional plane X-X through the computer system 1. The fan 10 suctions fresh air via a ventilation channel 15 out of a laterally offset intake area 16 of a housing rear wall 34 of a housing of a plastic material, which is not shown for the rest. The ventilation channel 15 is formed to be comparatively thin and wide to provide a relatively large cross section despite the small thickness of the housing of the computer system 1. For example, the distance between the rear side 6 of the first shielding casing 2, located at the top in FIG. 2, and the housing rear wall 34 is only about 5 mm, while the ventilation channel 15 extends over a width of approximately 75 mm in the direction perpendicular to the sectional plane, i.e. more than the tenfold. As a result, a relatively large effective cross section of the ventilation channel 15 along with, at the same time, a relatively flat structure of the computer system 1 is enabled. The ventilation channel 15 is formed in part by the housing rear wall 34 per se and rips formed thereon, and in part by the rear side 6 of the shielding casing 2.

The fan 10 accelerates the sucked-in fresh air in the direction of a heat sink 17, which is arranged, in a manner known per se, directly on a component to be cooled, in particular a processor 18 of the computer system 1. The processor 18 itself is received in a corresponding base 19 of a system board 20 and is located in a central area of the computer system 1, in which likewise a recess 39 of the VESA mount 7 for receiving a base plate of a corresponding mount is located. This region of the computer system 1 is relatively thick and thus allows the use of a conventional axial fan in place of complex cooling components such as in particular heat pipes or radial fans, as used for the cooling of laptop computers, for example. Axial fans are characterized by high energy efficiency and low operating noise. The axis of rotation of a fan impeller of the fan 10 is arranged perpendicular to the system board 20 and also perpendicular to the ventilation channel 15.

The above-mentioned components 10, 17, 18, 19 and 20 are enclosed by the first shielding casing 2. The first shielding casing 2 includes a first housing shell 22 and a second housing shell 23. As described above, the upper housing shell 22 separates the ventilation channel 15 from the interior of the first shielding casing 2 fluidically and in terms of pressure. The second housing shell 23 is a rear support plate, which is arranged parallel below the system board 20 and carries all modules of the computer system 1. A display screen 21 is arranged on its opposite side. Alternatively, the second housing shell 23 can be configured as a rear cover plate, which simply solely ensures an electromagnetic shielding of the system component 4.

The first housing shell 22 comprises, in the illustrated section, two areas with ventilation openings 9a and 9e. Besides the first ventilation openings 9a, which are directly arranged above the fan 10, a plurality of fifth ventilation openings 9e are furthermore recognizable in a right housing wall 14b, over which a part of the sucked-in fresh air 37 is discharged as third air flow 13c, directly out of the first shielding casing 2. A different part of the sucked-in fresh air 37 leaves the first shielding casing 2 as fourth air flow 13d via other ventilation openings, not recognizable in FIG. 2, and thus cools further components 24 of the system board 20 such as, for example, a voltage regulator that regulates a voltage supply of the processor 18.

Figure 3:
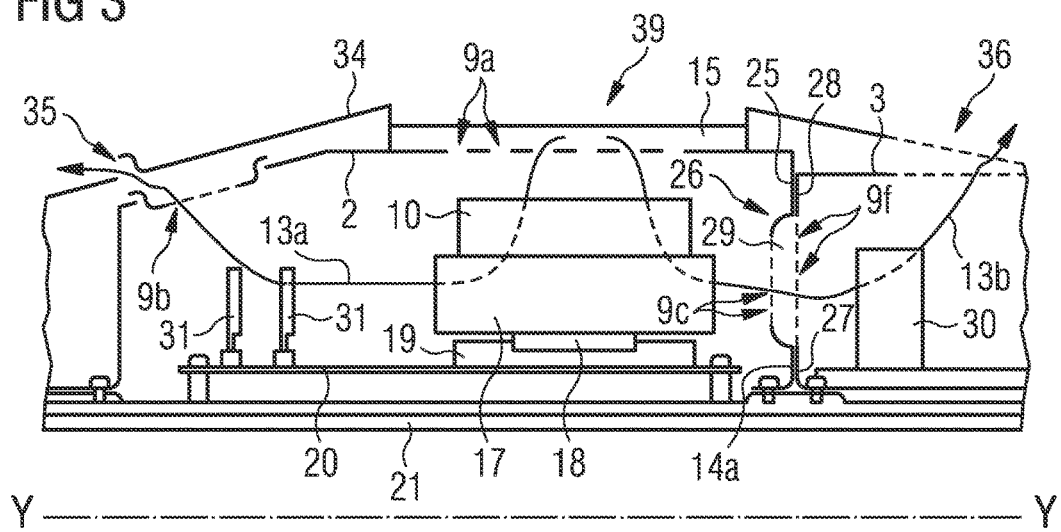
FIG. 3 shows a second cross section through a housing of the computer system according to FIG. 1.

In a directly neighboring arranging of the system components 4 and the power supply unit 5, as illustrated in the cross section along the sectional plane Y-Y of FIG. 3, a gap results between the third ventilation openings 9c of the first shielding casing 2 and corresponding sixth ventilation openings 9f of the upper housing wall 27 of the second shielding casing 3, through a recess 26 of the lower housing wall 14a. Only in a first contact area 25 of the second shielding casing 2 and a corresponding second contact area 28 of the second shielding casing 3, these directly contact one another. To improve the tightness, it is optionally possible, in this area, to apply a sealing agent onto the first contact area 25 and/or the second contact area 28. In the area of the third ventilation openings 9c and sixth ventilation openings 9f, the two housing walls 14a or 27 are spaced apart from one another. The area therebetween thus forms a pressure chamber 29 that serves for the cooling air ventilating coupling of the first shielding casing 2 and the second shielding casing 3. In this manner, a part of the air flow 13b generated by the fan 10 can be used to cool components 30 of the power supply unit 5, in particular parts of a converter circuit that converts a primary mains AC voltage into a secondary DC voltage to supply the system components 4, which are arranged in the second shielding casing 3. The air flow 13b exits the computer system 1 through a ventilation grille 36 in the housing rear wall 34. The air flow 13a likewise generated by the fan 10 serves, by contrast, to cool the storage modules 31a and exits the computer system 1 through an air vent 35 in the housing rear wall 34.

Through use of the pressure chamber 29, the housing assembly thus becomes independent of the exact arrangement and size of the neighboring ventilation openings 9c and 9f. This is particularly advantageous in the assembly of different system modules of different manufacturers, which, when necessary, are manufactured and/or mounted with different tolerances.

Besides forming the recess 26 in the lower housing wall 14a of the first shielding casing 2, represented in FIG. 3, forming a recess in the upper housing wall 27 of the second shielding casing 3 is alternatively or additionally possible. Furthermore, the fan 10 can also be arranged in the second shielding casing 3, or outside of the two shielding casings 2 and 3. A concatenation of more than two shielding casings is possible in principle, as long as an air flow generated to cool all components contained therein is sufficient. The direction of the air flow is also reversible, subject to the requirements of the components to be cooled.

Figure 4:
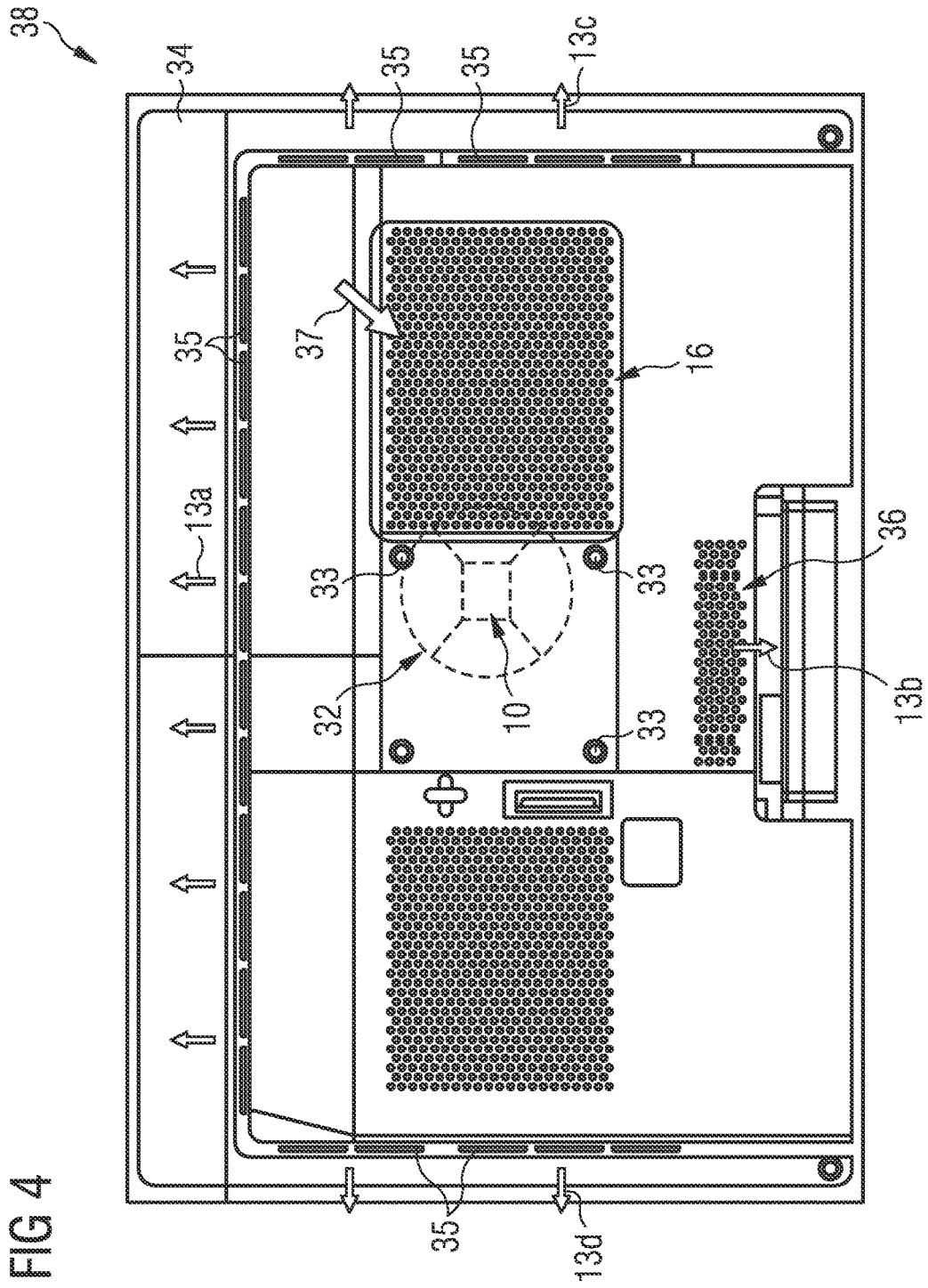
FIG. 4 shows a housing rear side of the computer system according to FIG. 1.

FIG. 4 shows the rear wall 34 of a housing 38 of the computer system 1. In the rear view, it is discernable that the intake area 16 for fresh air 37 is arranged laterally next to a recessed fastening region 32 in the example. In the fastening region 32, corresponding openings 33 to fasten the computer system 1 to a VESA mount by the fastening domes 8 located there-below of the VESA mount 7 are provided.

FIG. 4 also shows, with dashed lines, the position of the fan 10. It can be discerned that a direct supply or discharge of cooling air would not or only hardly be possible in the fastening region 32. Instead, the fastening region 32 and the intake area 16 are connected by the internal ventilation channel 15, as described above to enable a lateral air supply to the fan 10 arranged in the area of the largest thickness of the computer system 1.

It can also be discerned in FIG. 4 that the housing rear wall 34 of the computer housing 38 comprises a plurality of air vents 35 besides the air intake area 16, via which the fresh air 37 sucked in via the intake area 16 can be discharged to the surrounding environment again. The air vents 35 surround the components arranged in the computer housing 38 on three sides, upward, rightward and leftward, and let the air flows 13a, 13c and 13d escape. The air flow 13b flowing through the power supply unit 5 is discharged downward via the further exhaust grille 36 located at the bottom in FIG. 4. The air flows 13a to 13d discharged through the air vents 35 and the exhaust grille 36 flow laterally away from the intake area 16 so that a short-circuiting flow is prevented even outside the computer housing 38.

In another example, the flow of air is inverted with respect to the above description. In this case, the fan 10 generates an underpressure in the first shielding casing 2. Thus, fresh air is sucked in through the second, third and fourth ventilation openings 9b to 9d and is expelled by the fan 9 through the first ventilation openings 9a.

Compared to other possible approaches, for example, provision of multiple fans for various shielding casings or the use of relatively expensive heat pipes for the transmission of thermal energy from components to be cooled to other locations of a housing assembly, the previously-described cooling and ventilation system is particularly simple, economical and energy-saving. In particular, provision of additional fans and the associated mechanical and acoustic problems can be foregone. At the same time, a good compromise regarding the esthetic design of the computer system is enabled. In particular, the computer system can be formed relatively thin on its peripheral sides. Only the fastening region, which in any case is formed mechanically stronger, must be formed slightly thicker.

What is claimed is:

1. A computer system comprising:
    a computer housing with a fastening device that fastens the computer housing to a mount;
    a system component arranged in the computer housing and having at least one component to be cooled and comprises a processor of the computer system, the processor having a heat sink arranged directly thereon;
    an axial fan that cools the at least one component is arranged in the computer housing in a region of the processor, and accelerates air in a direction of the heat sink or away from it;
    a first ventilation area arranged laterally next to the fastening device in a first housing wall of the computer housing; and
    a ventilation channel extending in the computer housing between the first ventilation area and the axial fan, which is fluidically separated from the rest of the computer housing.

2. The computer system according to claim 1, further comprising a display screen with a display surface and integrated in the computer housing, wherein the system component is arranged on a side of the display screen opposite the display surface.

3. The computer system according to claim 2, wherein the display screen is arranged in a housing front wall facing a user, and the ventilation area is arranged in housing rear wall of the computer housing opposite the housing front wall.

4. The computer system according to claim 3, wherein the fastening device is formed with fastening points according to VESA standards MIS-D at distances of 75 mm or 100 mm, MIS-E at distances of 100 mm or 200 mm or MIS-F at distances of 200 mm, 400 mm, 600 mm or 800 mm as defined in VESA Flat Display Mounting Interface Standard Version 1, Rev. 1, Jan. 16, 2016, to fasten the computer system to a wall mount or a stand.

5. The computer system according to claim 1, further comprising at least one second ventilation area arranged in the first housing wall of the computer housing and spaced apart from the first ventilation area, wherein the first ventilation area takes in fresh air and the second ventilation area discharges air heated by the at least one component to be cooled or vice versa.

6. The computer system according to claim 5, wherein the first ventilation area includes at least one large-surface air intake area and the second ventilation area includes at least one slot-like air outlet area, and at least one slot-like air outlet area is configured such that the heated air discharged by it flows into a direction facing away from at least one large-surface air intake area.

7. The computer system according to claim 1, wherein the axial fan is arranged in a central area of the computer system, in which the fastening device is located.

8. The computer system according to claim 1, further comprising a plurality of the components to be cooled, wherein the axial fan is configured to cool all components arranged in the computer housing, and the plurality of components includes at least one further component not arranged on or in the system component.

9. The computer system according to claim 8, wherein the at least one further component includes a component of a fan-less power supply unit that supplies the system component with at least one supply voltage.

10. The computer system according to claim 1, wherein the axial fan is arranged in the computer housing such that the axis of rotation extends substantially perpendicular to an extension plane of a system board and an extension direction of the ventilation channel substantially parallel to the system board.

11. A computer system comprising:
    a computer housing with a fastening device that fastens the computer housing to a mount;
    a system board arranged in the computer housing and having at least one component to be cooled;
    an axial fan that cools the at least one component arranged in the computer housing in a region of the at least one component;
    a first ventilation area arranged laterally next to the fastening device in a first housing wall of the computer housing; and
    a ventilation channel extending in the computer housing between the first ventilation area and the axial fan, which is fluidically separated from the rest of the computer housing;
    wherein the axial fan is arranged in the computer housing such that an axis of rotation extends substantially perpendicular to an extension plane of the system board and an extension direction of the ventilation channel substantially parallel to the system board, and
    wherein the ventilation channel has a first inner width in the direction of the axis of rotation, a second inner width perpendicular to the extension direction of the ventilation channel, and the first inner width is smaller than the second inner width by at least one order of magnitude.

12. An all-in-one computer system, comprising
a computer housing;
a system board arranged in the computer housing and having at least one processor to be cooled;
a heat sink arranged directly on the processor;
a display screen arranged at a housing front wall of the computer housing facing a user;
a fastening device that fastens the computer housing to a display mount, the fastening device arranged at a rear wall of the computer housing opposite the housing front wall;
an axial fan that cools the at least one processor by accelerating air in the direction of the heat sink or away from it, the axial fan being arranged on the heat sink of the processor in a region of the fastening device;
a first ventilation area arranged laterally next to the fastening device in the rear wall of the computer housing; and
a ventilation channel extending in the computer housing between the first ventilation area and the axial fan, which is fluidically separated from the rest of the computer housing.

13. The all-in-one computer system according to claim 12, wherein the fan is configured with an air guidance parallel to an axis of rotation of a fan impeller of the axial fan, and the axial fan is arranged in the computer housing such that the axis of rotation extends substantially perpendicular to an extension plane of a system board and an extension direction of the ventilation channel substantially parallel to the system board; and the ventilation channel has a first inner width in the direction of the axis of rotation, a second inner width perpendicular to the extension direction of the ventilation channel, and the first inner width is smaller than the second inner width by at least one order of magnitude.

14. The all-in-one computer system according to claim 12, wherein at least the system board, the processor and the fan are arranged within a first shielding casing with a first ventilation opening arranged directly above the axial fan, and the first shielding casing serves to transmit force from the display mount to remaining modules of the all-in-one computer system.

15. The computer system according to claim 11, further comprising a display screen with a display surface and integrated in the computer housing, wherein the system board is arranged on a side of the display screen opposite the display surface.

16. The computer system according to claim 15, wherein the display screen is arranged in a housing front wall facing a user, and the ventilation area is arranged in housing rear wall of the computer housing opposite the housing front wall.

17. The computer system according to claim 11, wherein the axial fan is arranged in a central area of the computer system, in which the fastening device is located.

18. The computer system according to claim 11, further comprising a plurality of the components to be cooled, wherein the axial fan is configured to cool all components arranged in the computer housing, and the plurality of components includes at least one further component not arranged on the system board.

19. The computer system according to claim 18, wherein the at least one further component includes a component of a fan-less power supply unit that supplies the system board with at least one supply voltage.

20. The computer system according to claim 11, wherein at least the system board, the processor and the axial fan are arranged within a first shielding casing with a first ventilation opening arranged directly above the axial fan, and the first shielding casing serves to transmit force from the fastening device to at least one other module of the computer system.

* * * * *